(12) United States Patent
Park et al.

(10) Patent No.: US 7,238,258 B2
(45) Date of Patent: Jul. 3, 2007

(54) SYSTEM FOR PEELING SEMICONDUCTOR CHIPS FROM TAPE

(75) Inventors: Soo-San Park, Seoul (KR); Gab-Yong Min, Kyoungki-Do (KR); Jin-Wook Jeong, Kyoungki-Do (KR); Hee Bong Lee, Kyoungki-Do (KR); Jason Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 42 days.

(21) Appl. No.: 10/907,991

(22) Filed: Apr. 22, 2005

(65) Prior Publication Data

US 2006/0237142 A1  Oct. 26, 2006

(51) Int. Cl.
*B32B 38/10* (2006.01)
*H01L 21/687* (2006.01)

(52) U.S. Cl. ............... 156/344; 156/584; 438/464; 438/976

(58) Field of Classification Search .......... 156/344, 156/584; 438/464, 976
See application file for complete search history.

(56) References Cited

U.S. PATENT DOCUMENTS

| | | | |
|---|---|---|---|
| 6,436,795 B2 | 8/2002 | Noguchi et al. | 438/460 |
| 6,607,970 B1 | 8/2003 | Wakabayashi | 438/462 |
| 6,709,543 B2 * | 3/2004 | Kurosawa | 156/344 |
| 6,774,011 B2 | 8/2004 | Nakazawa | 438/464 |
| 6,824,643 B2 * | 11/2004 | Yoshimoto et al. | 156/344 |
| 6,896,762 B2 * | 5/2005 | Huang et al. | 156/344 |
| 2002/0019074 A1 * | 2/2002 | Nakazawa et al. | 438/107 |
| 2004/0038498 A1 * | 2/2004 | Ozono et al. | 438/464 |
| 2004/0038499 A1 * | 2/2004 | Kim et al. | 438/464 |
| 2005/0274457 A1 * | 12/2005 | Cheung et al. | 156/344 |

FOREIGN PATENT DOCUMENTS

| | | | | |
|---|---|---|---|---|
| JP | 62098638 A | * | 5/1987 | |
| JP | 04320046 A | * | 11/1992 | |
| JP | 10199961 A | * | 7/1998 | |

* cited by examiner

*Primary Examiner*—Mark A. Osele
(74) *Attorney, Agent, or Firm*—Mikio Ishimaru; William D. Zahrt, II (57) ABSTRACT

A system for peeling semiconductor chips from tape is provided with a nose on a housing. The nose has transverse dimensions smaller than the transverse dimensions of a target chip. Apertures are provided through the nose from the housing. Vacuum ports are provided in the housing adjacent the nose. A vacuum source controllably connects to the apertures and the vacuum ports. The nose is positioned adjacent a tape attached on the opposite side thereof to the target chip. Vacuum is applied to attract the tape against the nose and the adjacent portions of the housing to peel the tape from the peripheral edges of the target chip while supporting the tape in the center of the target chip.

16 Claims, 5 Drawing Sheets

SYSTEM FOR PEELING SEMICONDUCTOR CHIPS FROM TAPE

TECHNICAL FIELD

The present disclosure relates generally to semiconductor technology, and more particularly to a system for peeling semiconductor chips from tape.

BACKGROUND ART

In the fabrication of semiconductor chips, multiple chips are commonly fabricated simultaneously together on a large wafer. When the wafer is completed, it is then necessary to separate, or "singulate", the individual chips from one another. One typical process for singulating the chips is to cut the wafers with precision diamond saws that isolate the individual chips from one another by the width of the saw. To protect the chips and the wafer during this singulation process, an adhesive tape is commonly first applied to a surface of the wafer, generally to the bottom surface.

Following singulation, it is then necessary to remove the chips individually from the adhesive tape. Unfortunately, as technological advances have continuously reduced the dimensions and thicknesses of chips, they have become increasingly fragile and subject to cracking during removal from the adhesive tape. Thus, product losses have been continually increasing, whereas competitive pressures for lower prices and increased production efficiency have made such product losses ever increasingly intolerable.

Various solutions have been attempted to mitigate this problem. For example, careful adjustments have been made to the adhesive strength of the tape to reduce the tape holding force on the chip to just the minimum that is feasible. However, the tape holding force must be sufficient to secure the chips during the singulation sawing process. With the ever accelerating reduction in chip sizes and thicknesses, it is ever more and more difficult to lift or pull the individual chips off of the adhesive tape without cracking the chips, regardless of the adhesive strength. This is particularly true, for example, for conventional peeling methods such as those that use needles to push the chips off of the adhesive tape.

Unfortunately, therefore, as the chips become ever thinner (for example, below 125 µm thickness), the chips become ever more vulnerable to random chip cracking during chip peeling from the tape. This renders the chips unavailable for subsequent bonding to upcoming production objects such as printed circuit boards, substrates, leadframes, and so forth. This makes production delays and losses even worse.

Thus, a need still remains for significant improvements in systems for peeling singulated semiconductor chips from tape during the fabrication thereof. In view of increasing competitive pressures, increasing production volumes and production demands, declining profit margins, and the ever decreasing physical sizes and strengths of semiconductor chips, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a system for peeling semiconductor chips from tape. A nose on a housing is provided. The nose has transverse dimensions smaller than the transverse dimensions of a target chip. Apertures are provided through the nose from the housing. Vacuum ports are provided in the housing adjacent the nose. A vacuum source controllably connects to the apertures and the vacuum ports. The nose is positioned adjacent a tape attached on the opposite side thereof to the target chip. Vacuum is applied to attract the tape against the nose and the adjacent portions of the housing to peel the tape from the peripheral edges of the target chip while supporting the tape in the center of the target chip.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the semiconductor chip, regardless of its orientation. The term "vertical" refers to a direction perpendicular to the horizontal as just defined. Terms, such as "on", "above", "below", "bottom", "top", "side" (as in "sidewall"), "transverse", "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

It has been discovered that substantial improvements in chip singulation and separation from a wafer, with concomitant significantly reduced incidences of chip cracking, can be achieved. As disclosed and taught herein, this is unexpectedly accomplished by initially peeling adhesive tape from beneath the edges of a singulated chip prior to removing the entire chip from the adhesive tape. The system for peeling semiconductor chips from tape according to the present invention thus provides a useful and powerful solution for chip singulation free from cracking. That is, by first pre-peeling the tape from beneath just the edges of each chip, subsequent methods such as needle lifting can then be employed to complete the separation of the chip from the tape without incurring or causing chip cracking.

In one embodiment, it has been discovered that vacuum can initially peel or separate the adhesive tape from the edges of the chip. The housing of a needle lifter is provided with a new, central peeling nose. The nose is a boss or raised portion that extends above the normal contacting surface adjacent the nose on the end of the housing of the needle lifter. The nose is smaller in transverse dimensions than the corresponding transverse dimensions of individual chips, and includes apertures across its surface for applying a vacuum suction force. These apertures, in one embodiment, are dual purpose and also provide a pathway for the needles, enabling them to be extended upwardly through the nose and retracted back into the nose as further described below.

The housing is also provided with holes or vacuum ports on the normal contacting surface thereof surrounding the nose. These vacuum ports are for also applying a vacuum suction force to the adhesive tape in the vicinity of the chip that has been selected for separation from the adhesive tape.

The separation needles are supported within the housing on a needle holder that is vertically movable in an up-down manner. The movement may be provided, for example, by means of an up-down shaft that supports the needle holder and is driven and controllably actuated in the usual fashion.

As thus configured, the system for peeling semiconductor chips from tape, in one embodiment, operates as follows. First, the nose is centered beneath a selected (or "target") chip and is raised into contact with the adhesive tape on the back side of the chip. The needle lifter (including the nose and the needle lifter housing) then continues to be elevated, causing the nose to lift the chip slightly above the adjacent chips until the normal contacting surface of the needle lifter is brought into contact with the bottom surface of the adhesive tape beneath adjacent chips. The target chip, that is now supported on the nose of the needle lifter, then begins the process of tape removal from the bottom thereof. The housing of the needle lifter is evacuated, causing a downward vacuum attraction to be applied to the tape that is thereabove and in contact with the normal contacting surface of the housing, and is in contact with the nose in the center thereof.

The nose supports the tape across the central surface of the target chip. However, the nose is smaller in transverse dimensions than the target chip. The nose thus does not support the tape around the edges of the target chip, but instead allows the tape to be gently peeled from the chip edges, around the periphery of the nose. Thus the tape is gently peeled from just the edges of the chip. Effectively, this means that the tape has been pre-peeled from the edges of the chip.

Following the pre-peeling, the tape is peeled from the remainder of the chip by the needles, which are lifted through the vacuum apertures in the nose to push the chip off of the tape that still adheres in the center. This separation of the target chip from the adhesive tape by the needles is assisted by the vacuum attraction that is applied through the vacuum apertures during this final separation phase.

Figure 1:
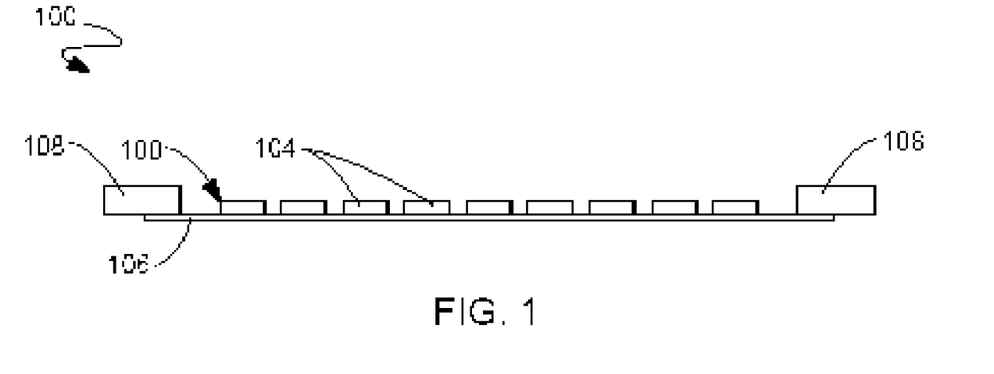
FIG. 1 is a figurative, cross-sectional view of a wafer that has been singulated into chips.
Figure 2:
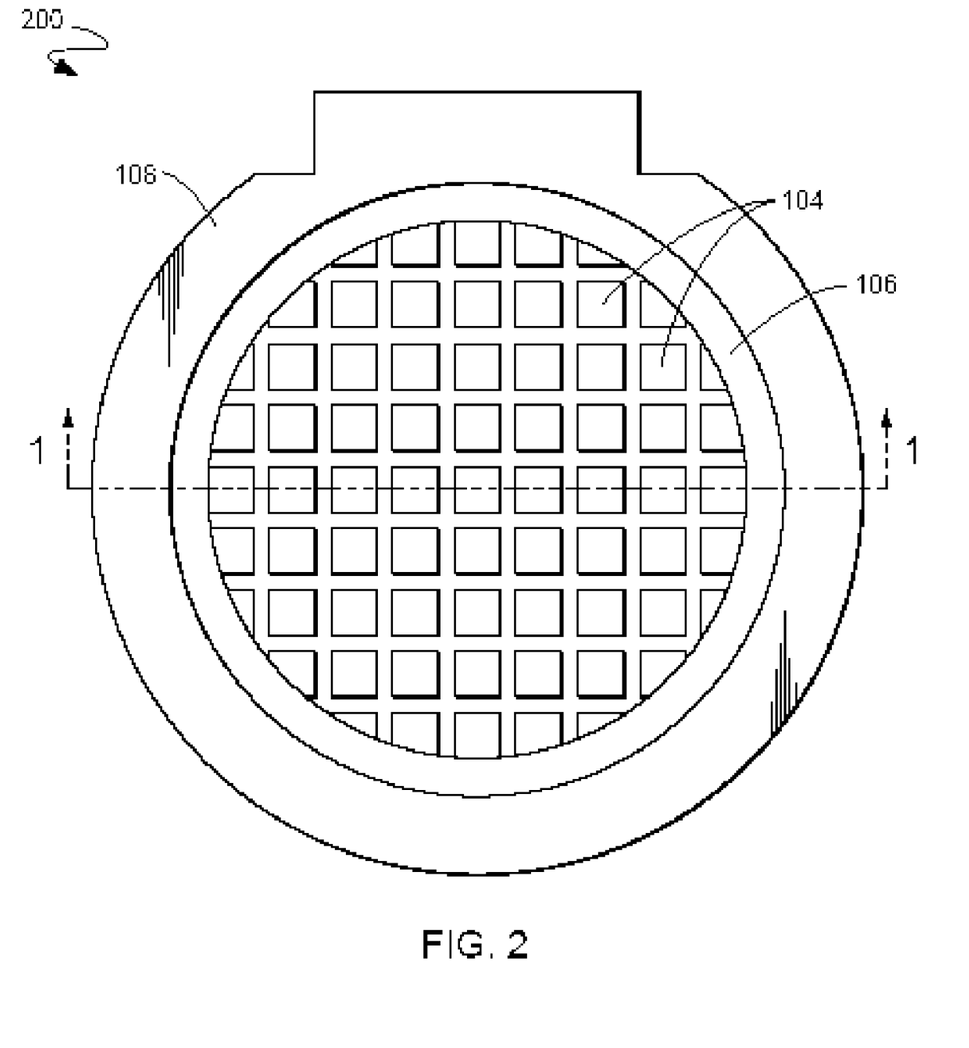
FIG. 2 is a top plan view of the structure of FIG. 1.

Referring now to FIG. 1, therein is shown a figurative, cross-sectional view 100, taken on line 1—1 in FIG. 2, of a wafer 102 that has been singulated into chips 104 after attachment to an adhesive tape 106 within a frame or carrier 108.

Referring now to FIG. 2, therein is shown a top plan view 200 of the structure illustrated in FIG. 1.

Figure 3:
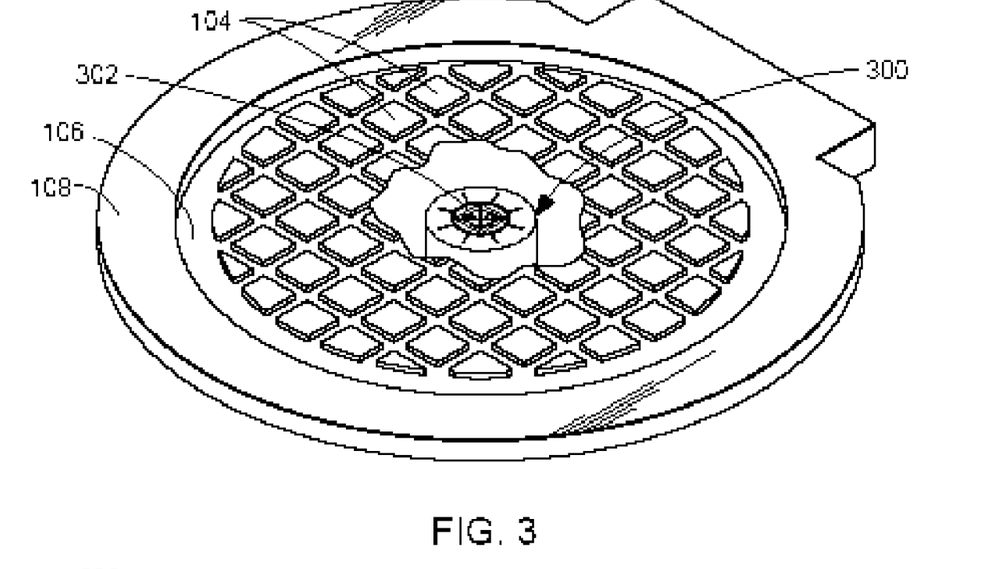
FIG. 3 is a partially broken-away isometric view of the structure of FIG. 2 with an embodiment of a system for peeling semiconductor chips from tape positioned beneath.

Referring now to FIG. 3, therein is shown a partially broken-away isometric view of the structure of FIG. 2, beneath which an embodiment of a system 300 for peeling semiconductor chips from tape has been positioned. As described more particularly hereinafter, the system 300 has a nose 302 that has been centered beneath a particular target chip 104' (not shown in FIG. 3, but see FIGS. 4 and 5) for separation of the target chip 104' from the adhesive tape 106.

Figure 4:
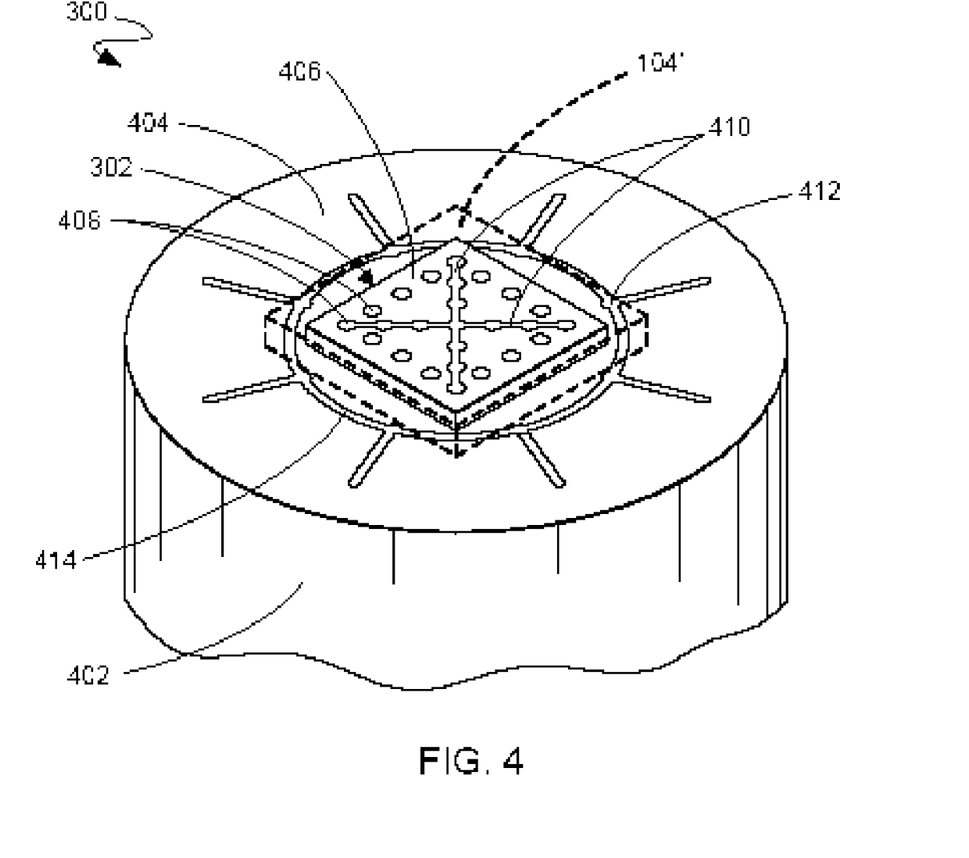
FIG. 4 is an enlarged view of the center portion of the system shown in FIG. 3.

Referring now to FIG. 4, therein is shown an enlarged view of the center portion of FIG. 3 that illustrates the system 300. The nose 302 of the system 300 is located centrally on the top of a housing 402 and extends and is raised by a modest height above a normal contacting surface 404 adjacent the nose 302 on the top of the housing 402. For example, the nose 302 may be raised by half the thickness of a chip, such as one of the chips 104 (FIG. 3), e.g., the target chip 104'. The outer dimensions of the nose 302 are smaller in transverse extent or dimensions than the transverse dimensions of the chips 104.

The top surface 406 of the nose 302 is provided with apertures 408, some of which are connected to connecting vacuum channels 410. In one embodiment, the connecting vacuum channels 410 are shaped in an X pattern. The normal contacting surface 404 of the housing 402 is provided with vacuum ports 412 and connecting vacuum channels 414. In one embodiment, the vacuum ports 412 are located adjacent or in the vicinity of the nose 302, and the connecting vacuum channels 414 are configured as a ring having arms extending outwardly therefrom.

In operation, the nose 302 will be centered beneath a chip, such as the target chip 104' (as shown in phantom), that is to be separated from the adhesive tape 106 (FIG. 3).

Figure 5:
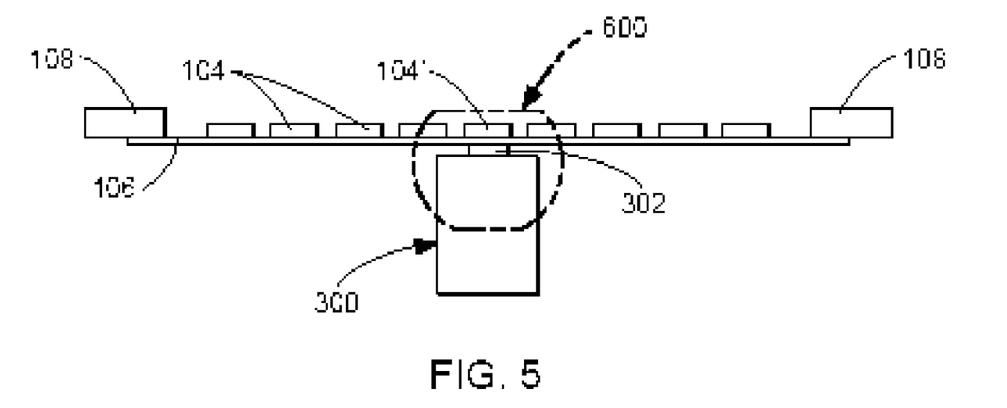
FIG. 5 is a view similar to FIG. 1 with the system of FIG. 3 positioned beneath a target chip.

Referring now to FIG. 5, therein is shown a view similar to FIG. 1 with the system 300 operationally positioned beneath the target chip 104'. A portion of FIG. 5 is identified within an outline 600, which is described in greater detail below.

Figure 6:
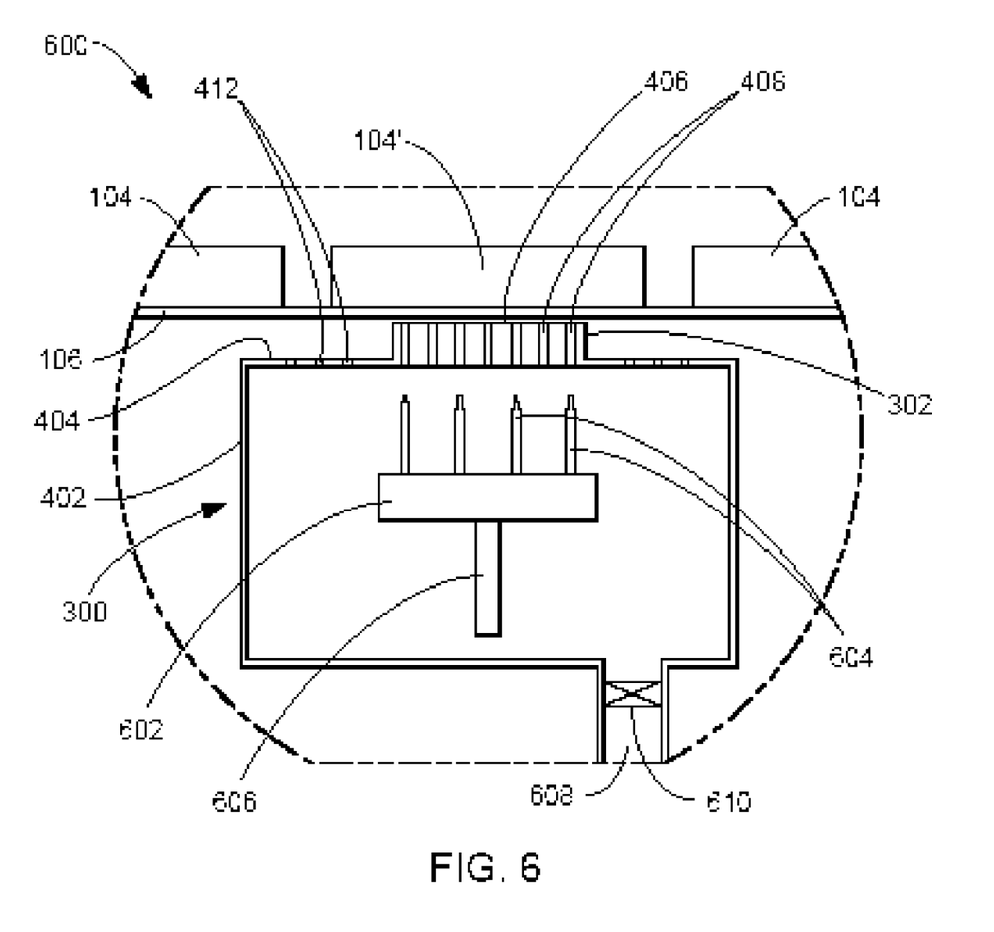
FIG. 6 is an enlarged sectional view of a portion of the structure of FIG. 5 within an outline therein.

Referring now to FIG. 6, therein is shown an enlarged sectional view of the portion of FIG. 5 within the outline 600 therein. In FIG. 6, some elements of the system 300 within the outline 600 have been omitted for clarity of illustration.

As shown in FIG. 6, the nose 302 of the system 300 has been centered beneath the target chip 104'. The top surface 406 of the nose 302 is adjacent and about to contact the adhesive tape 106 on the bottom side of the tape opposite the target chip 104'.

Within the housing 402 and beneath the nose 302 is a needle holder 602. The needle holder 602 supports needles 604 that are beneath and aligned with corresponding apertures 408. In turn, the needle holder 602 is connected to and supported by an actuation shaft 606 that is configured in known fashion for controlled upward and downward movement. The controlled upward and downward movement of the actuation shaft 606 extends the needles 604 correspondingly upwardly partly through the apertures 408 (see FIG. 8) and then retracts the needles 604 back downwardly through the apertures 408 into the interior of the housing 402.

A portion of the interior of the housing 402 of the system 300 is hollow. To evacuate this portion of the interior of the system 300, a vacuum source 608 is connected to the interior of the housing 402 through a valve 610. In one embodiment, the valve 610 is an integral part of the vacuum source 608. The valve 610 can be actuated to evacuate the hollow interior of the housing 402 and to apply vacuum to the apertures 408, the connecting vacuum channels 410 (when covered by the adhesive tape 106), the vacuum ports 412, and the connecting vacuum channels 414 (when covered by the adhesive tape 106).

Figure 7:
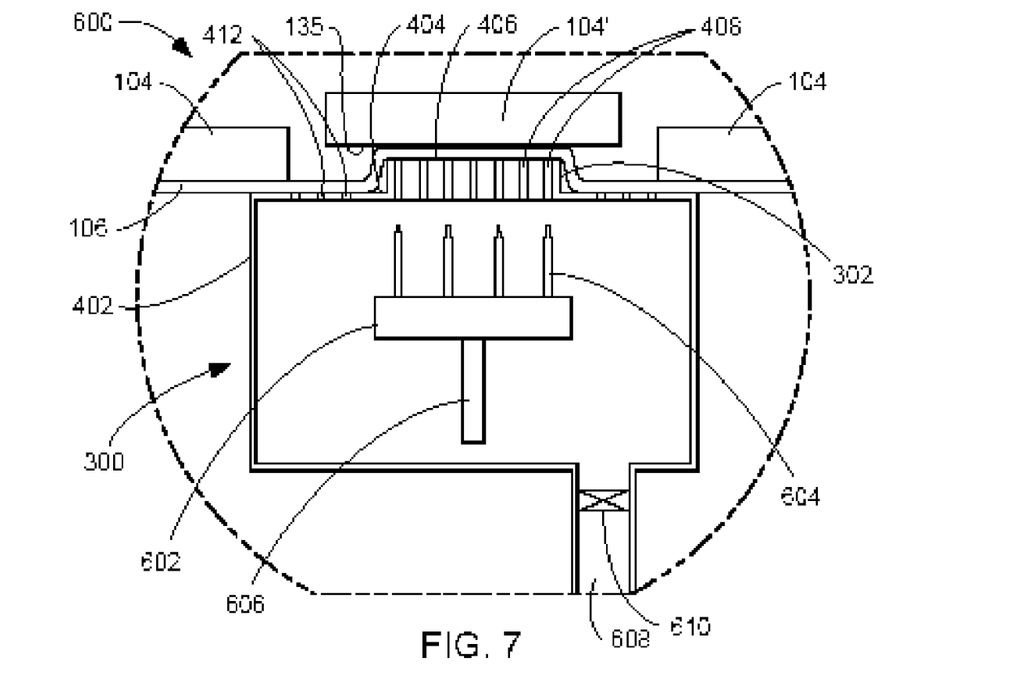
FIG. 7 is a view similar to FIG. 6 showing the next step in the system for peeling semiconductor chips from tape in accordance with the present invention.

Referring now to FIG. 7, therein is shown a view similar to FIG. 6, illustrating the next step in the operation of the system 300 for peeling semiconductor chips from tape. The valve 610 has been opened to connect the vacuum source 608 to the interior of the housing 402. The attraction of the vacuum has drawn the adhesive tape 106 down against the normal contacting surface 404 of the housing 402, and holds the adhesive tape 106 there by means of the vacuum ports 412 and the connecting vacuum channels 414 (FIG. 4). The vacuum also draws the adhesive tape 106 in like manner firmly down onto the top surface 406 of the nose 302, by virtue of the apertures 408.

As shown in FIG. 7, the system 300 has also been raised to elevate the target chip 104'. By virtue of the attraction of the vacuum on the adhesive tape 106, the portions of the adhesive tape laterally beyond the nose 302, around the peripheral edges of the target chip 104', have been peeled away from the peripheral edges of the target chip 104' and are held away therefrom on the normal contacting surface 404 of the housing 402. At the same time, the nose 302 supports the adhesive tape 106 in the center of the target chip 104', effectively resisting and preventing peeling of the adhesive tape 106 from the center of the target chip 104' at this time.

Figure 8:
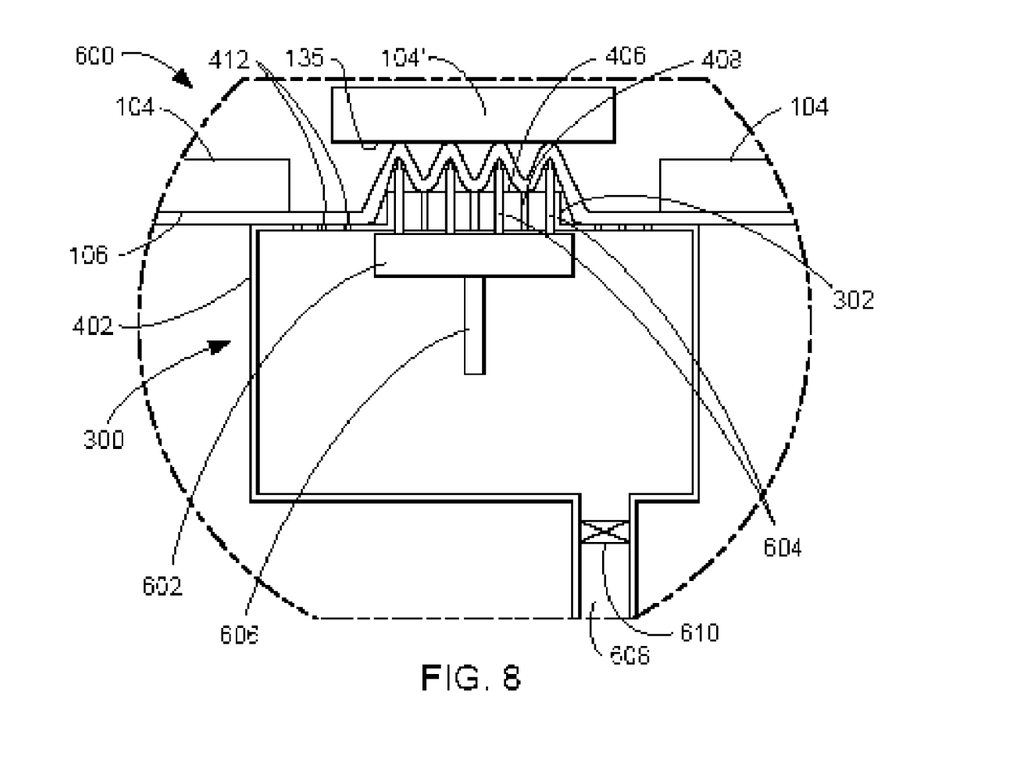
FIG. 8 is a view similar to FIG. 7 illustrating the final step in the system for peeling semiconductor chips from tape.

Referring now to FIG. 8, therein is shown a view similar to FIG. 7, illustrating the final steps in separating the target chip 104' from the adhesive tape 106, just prior to lifting the target chip 104' away therefrom. The needles 604 have been actuated and raised by the actuation shaft 606 and extend partly through their corresponding apertures 408 to lift the target chip 104' away from the top surface 406 of the nose 302. The valve 610 is maintained in an open condition so that vacuum continues to be applied beneath the adhesive tape 106. This causes the portions of the adhesive tape 106 not contacted or supported by the needles 604 to continue to be held against the nose 302 and thus to separate from the target chip 104'. The target chip 104' is thus almost completely peeled from the adhesive tape 106 and can then be readily and easily removed in known fashion for subsequent bonding to any preferred target object, such as a printed circuit board, a leadframe, other substrate, and so forth.

Following removal of the target chip 104', the actuation shaft 606 is returned downwardly, the valve 610 is closed to release the vacuum, and the nose 302 and the system 300 are retracted downwardly away from the adhesive tape 106. The system 300 is then ready to successfully separate another chip 104 from the adhesive tape 106 and is accordingly centered beneath another such chip 104, in the same manner as shown in FIG. 5. The process is then repeated.

Based on this disclosure, it will now be clear to one of ordinary skill in the art that a system for peeling semiconductor chips from tape has been discovered that significantly reduces the incidences of chip damage and fracture. The random failure of chips due to the stress of being pried from the adhesive tape by prior needle ejector configurations has been very substantially improved. The improvement is due to the unobvious initial release of the adhesive tape from the peripheral edges of the chips prior to the actuation of the needle ejector mechanism.

The central peeling nose of the present invention provides physical and structural support for the major, central portion of the chip body. This protects it from undue stresses, particularly the leverage stresses that can occur from forces applied at the chip periphery or edge, that are then amplified through a centrally positioned fulcrum such as an ejection needle. Instead, the risk of such forces at the chip edges is eliminated by the present invention by the initial or preliminary peeling of the tape from the peripheral edges of the chip prior to actuation of the ejection needles.

Figure 9:
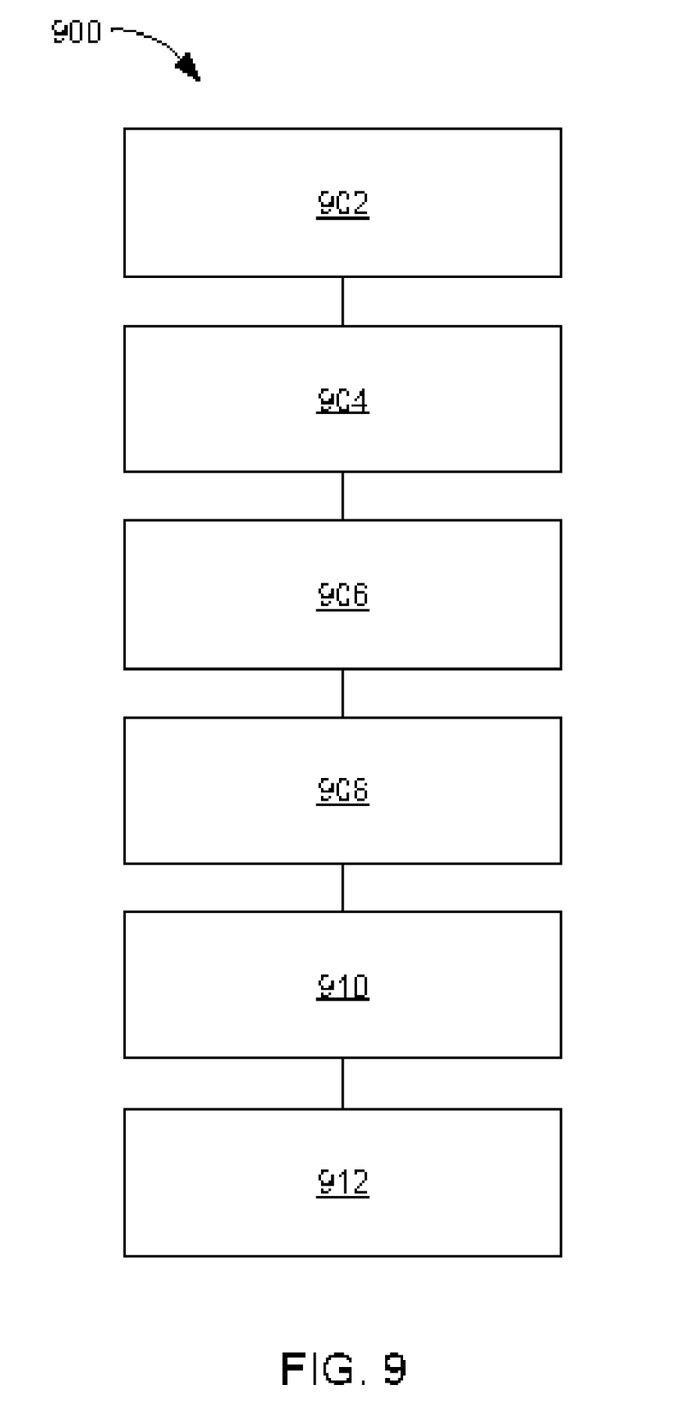
FIG. 9 is a flow chart of a system for peeling semiconductor chips from tape in accordance with an embodiment of the present invention.

Referring now to FIG. 9, therein is shown a flow chart 900 of a system for peeling semiconductor chips from tape in accordance with an embodiment of the present invention. The system includes providing a nose on a housing, the nose having transverse dimensions smaller than the transverse dimensions of a target chip, in a block 902; providing apertures through the nose from the housing, in a block 904; providing vacuum ports in the housing adjacent the nose, in a block 906; providing a vacuum source that controllably connects to the apertures and the vacuum ports, in a block 908; positioning the nose adjacent a tape attached on the opposite side thereof to the target chip, in a block 910; and applying vacuum to attract the tape against the nose and the adjacent portions of the housing to peel the tape from the peripheral edges of the target chip while supporting the tape in the center of the target chip, in a block 912.

It has been discovered that the present invention thus has numerous advantages.

A principle advantage of the present invention is that it provides significant improvements in systems for peeling semiconductor chips from tape during the fabrication thereof.

Another advantage is that it enables successful peeling from adhesive backing tape of ever and increasingly thinner chips that are becoming ever more vulnerable to random chip cracking during such chip peeling.

Still another advantage of the present invention is that it accordingly reduces production failures and losses and increases production yields, outputs, and efficiencies.

Yet another advantage of the present invention is that it can be unexpectedly and surprisingly easily and readily implemented with inexpensive modifications and improvements to existing chip production equipment configurations.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the system for peeling semiconductor chips from tape of the present invention furnish important and heretofore unknown and unavailable solutions, capabilities, and functional advantages for significantly improving chip-from-wafer singulation processes, efficiencies, costs, and performance. The resulting processes and configurations are straightforward, cost-effective, uncomplicated, highly versatile and effective, can be implemented by adapting known technologies, and are thus readily suited for efficiently and economically singulating integrated circuit chips.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for peeling semiconductor chips from tape, comprising:
   providing a nose on a housing, the nose having transverse dimensions smaller than the transverse dimensions of a target chip;
   providing apertures through the nose from the housing;
   providing vacuum channels on the nose having an X pattern and connected to at least some of the apertures;
   providing vacuum ports in the housing adjacent the nose;
   providing vacuum channels on the housing having a ring pattern with arms extending therefrom and connected to at least some of the vacuum ports;
   providing a vacuum source that controllably connects to the apertures and the vacuum ports;
   positioning the nose adjacent a tape attached on the opposite side thereof to the target chip; and
   applying vacuum to attract the tape against the nose and the adjacent portions of the housing to peel the tape from the peripheral edges of the target chip while supporting the tape in the center of the target chip.

2. The method of claim 1 further comprising providing a plurality of needles within the housing actuateable for movement extending the needles at least partly through the apertures and retracting the needles back through the apertures.

3. The method of claim 1 further comprising:
   providing a plurality of needles within the housing actuateable for movement extending the needles at least partly through the apertures and retracting the needles back through the apertures;
   extending the needles through the apertures to lift the target chip substantially away from the tape;
   retracting the needles back through the apertures;
   releasing the vacuum;
   retracting the nose away from the tape; and
   positioning the nose adjacent the tape opposite another chip.

4. The method of claim 1 wherein the target chip is one of a plurality of chips singulated from a wafer after attachment to the tape.

5. A method for peeling semiconductor chips from tape, comprising:
   providing a raised nose on a housing, the nose having transverse dimensions smaller than the transverse dimensions of a target chip;
   providing apertures through the nose from the interior of the housing;
   providing vacuum ports in the housing adjacent the nose;
   providing vacuum channels connected to at least some of the vacuum ports and vacuum channels connected to at least some of the apertures, the vacuum channels connected to the apertures further comprising an X pattern, and the vacuum channels connected to the vacuum ports further comprising a ring with arms extending outwardly therefrom;
   providing a plurality of needles within the housing actuateable for movement extending the needles at least partly through the apertures and retracting the needles back through the apertures;
   providing a vacuum source and a valve therefor that controllably connects to the interior of the housing and therethrough to the apertures and the vacuum ports;
   centering the nose adjacent an adhesive tape attached on the opposite side thereof to the target chip;
   elevating the housing and the nose thereon; and
   opening the valve to attract the adhesive tape against the nose and the adjacent portions of the housing to peel the adhesive tape from the peripheral edges of the target chip while supporting the adhesive tape in the center of the target chip.

6. The method of claim 5 further comprising extending the needles through the apertures to lift the target chip substantially away from the remainder of the adhesive tape.

7. The method of claim 5 further comprising:
   extending the needles through the apertures to lift the target chip substantially away from the remainder of the adhesive tape;
   retracting the needles back through the apertures;
   releasing the vacuum;
   retracting the nose downwardly away from the adhesive tape; and
   centering the nose adjacent the adhesive tape opposite another chip.

8. The method of claim 5 wherein the target chip is one of a plurality of chips singulated from a wafer after attachment to the adhesive tape.

9. A system for peeling semiconductor chips from tape, comprising:
   a housing;
   a nose on the housing, the nose having transverse dimensions smaller than the transverse dimensions of a target chip;
   apertures through the nose from the housing;
   vacuum channels on the nose having an X pattern and connected to at least some of the apertures;
   vacuum ports in the housing adjacent the nose;
   vacuum channels on the housing having a ring pattern with arms extending therefrom and connected to at least some of the vacuum ports;
   a vacuum source that controllably connects to the apertures and the vacuum ports; and
   the system being configured for:
   positioning the nose adjacent a tape attached on the opposite side thereof to the target chip; and
   applying vacuum to attract the tape against the nose and the adjacent portions of the housing to peel the tape from the peripheral edges of the target chip while supporting the tape in the center of the target chip.

10. The system of claim 9 further comprising a plurality of needles within the housing actuateable for movement extending the needles at least partly through the apertures to lift the target chip substantially away from the remainder of the adhesive tape.

11. The system of claim 9 further comprising a plurality of needles within the housing actuateable for movement:
   extending the needles at least partly through the apertures; and
   retracting the needles back through the apertures.

12. The system of claim 9 wherein the target chip is one of a plurality of chips singulated from a wafer after attachment to the tape.

13. A system for peeling semiconductor chips from tape, comprising:
   a housing;
   a nose on the housing, the nose having transverse dimensions smaller than the transverse dimensions of a target chip;
   apertures through the nose from the interior of the housing;
   vacuum ports in the housing adjacent the nose;
   vacuum channels connected to at least some of the vacuum ports and vacuum channels connected to at least some of the apertures, the vacuum channels connected to the apertures further comprising an X pattern, and the vacuum channels connected to the vacuum ports further comprising a ring with arms extending outwardly therefrom;
   a plurality of needles within the housing actuateable for movement extending the needles at least partly through the apertures and retracting the needles back through the apertures;
   a vacuum source and a valve therefor that controllably connects to the interior of the housing and therethrough to the apertures and the vacuum ports; and
   the system being configured for:
   centering the nose adjacent an adhesive tape attached on the opposite side thereof to the target chip;
   elevating the housing and the nose thereon; and opening the valve to attract the adhesive tape against the nose and the adjacent portions of the housing to peel the adhesive tape from the peripheral edges of the target chip while supporting the adhesive tape in the center of the target chip.

14. The system of claim 13 wherein the needles are actuateable for movement extending the needles through the apertures to lift the target chip substantially away from the remainder of the adhesive tape.

15. The system of claim 13 wherein the needles are actuateable for movement:
   extending the needles through the apertures; and
   retracting the needles back through the apertures.

16. The system of claim 13 wherein the target chip is one of a plurality of chips singulated from a wafer after attachment to the adhesive tape.

* * * * *